US007882418B2

(12) United States Patent
Lee et al.

(10) Patent No.: US 7,882,418 B2
(45) Date of Patent: Feb. 1, 2011

(54) LDPC ENCODER AND DECODER AND LDPC ENCODING AND DECODING METHODS

(75) Inventors: Sang Hyun Lee, Daejeon (KR); Jae Young Ahn, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 368 days.

(21) Appl. No.: 11/721,162

(22) PCT Filed: Dec. 7, 2005

(86) PCT No.: PCT/KR2005/004177

§ 371 (c)(1),
(2), (4) Date: Nov. 29, 2008

(87) PCT Pub. No.: WO2006/062351

PCT Pub. Date: Jun. 15, 2006

(65) Prior Publication Data

US 2009/0249159 A1      Oct. 1, 2009

(30) Foreign Application Priority Data

Dec. 8, 2004    (KR)    ........................ 10-2004-0103240
Jul. 14, 2005    (KR)    ........................ 10-2005-0063905

(51) Int. Cl.
*H03M 13/00*    (2006.01)
(52) U.S. Cl. .................................... 714/758; 714/774
(58) Field of Classification Search ................. 714/758, 714/774
See application file for complete search history.

(56) References Cited

U.S. PATENT DOCUMENTS 6,633,856 B2 *  10/2003  Richardson et al. ........... 706/15

6,715,121 B1     3/2004  Laurent (Continued)

FOREIGN PATENT DOCUMENTS

EP        1480346 A1     11/2004

(Continued)

OTHER PUBLICATIONS

European Search Report on PCT/KR2005/004177 filed on Dec. 7, 2005.

(Continued)

*Primary Examiner*—M. Mujtaba K Chaudry

(57) ABSTRACT

Provided are an LDPC encoder and decoder, and LDPC encoding and decoding methods. The LDPC encoder includes: a code generating circuit that includes a memory storing a first parity check matrix and sums a first row which is at least one row of the first parity check matrix and a second row which is at least one of the remaining rows of the first parity check matrix to output a second parity check matrix; and an encoding circuit receiving the second parity check matrix and an information word to output an LDPC-encoded code word. Also the LDPC decoder includes: a code generating circuit including a memory which stores a first parity check matrix and summing a first row which is at least one row of the first parity check matrix and a second row which is at least one of the remaining rows of the first parity check matrix to output a second parity check matrix; and a decoding circuit receiving the second parity check matrix and a code word to output an LDPC-decoded information word.

48 Claims, 4 Drawing Sheets

U.S. PATENT DOCUMENTS

| | | |
|---|---|---|
| 6,789,227 B2 * | 9/2004 | De Souza et al. ............ 714/804 |
| 6,895,547 B2 * | 5/2005 | Eleftheriou et al. ......... 714/801 |
| 7,139,959 B2 * | 11/2006 | Hocevar ..................... 714/752 |
| 2002/0051501 A1 * | 5/2002 | Demjanenko et al. ....... 375/298 |
| 2004/0064776 A1 | 4/2004 | Yedidia et al. |
| 2004/0194007 A1 * | 9/2004 | Hocevar ..................... 714/801 |
| 2006/0020870 A1 * | 1/2006 | Hocevar ..................... 714/752 |
| 2006/0036927 A1 * | 2/2006 | Kyung et al. ................ 714/758 |
| 2006/0156183 A1 * | 7/2006 | Kim et al. ................... 714/758 |
| 2007/0011568 A1 * | 1/2007 | Hocevar ..................... 714/758 |

FOREIGN PATENT DOCUMENTS

| | | |
|---|---|---|
| EP | 1610466 A1 | 12/2005 |
| KR | 1020040033554 A | 4/2004 |
| KR | 1020040044590 A | 5/2004 |
| WO | WO2004006442 A1 | 1/2004 |
| WO | WO2004047307 A1 | 6/2004 |
| WO | WO2004102810 A1 | 11/2004 |

OTHER PUBLICATIONS

Eli Shasha et al., "Multi-Rate LDPC code for OFDMA PHY", IEEE 802.16 Broadband Wireless Access Working Group, Jun. 2004, pp. 0-17, IEEE.

Brian Classon et al., "LDPC coding for OFDMA PHY", IEEE 802.16 Broadband Wireless Access Working Group, Aug. 2004, pp. 0-17, IEEE.

Wilson S. G, "Linear Block Codes", pp. 411-425, 470-481, 489-493.

Yu Kou et al., "Low-Density Parity-Check Codes Based on Finite Geometries: A Rediscovery and New Results", IEEE Transactions on Information Theory, Nov. 2001, pp. 2711-2736, vol. 47, No. 7, IEEE.

Kenneth Andrews et al., "LDPC Decoding Using Multiple Representations", ISIT 2002, Jun.-Jul. 2002, pp. 456, IEEE.

* cited by examiner

[Fig. 1]
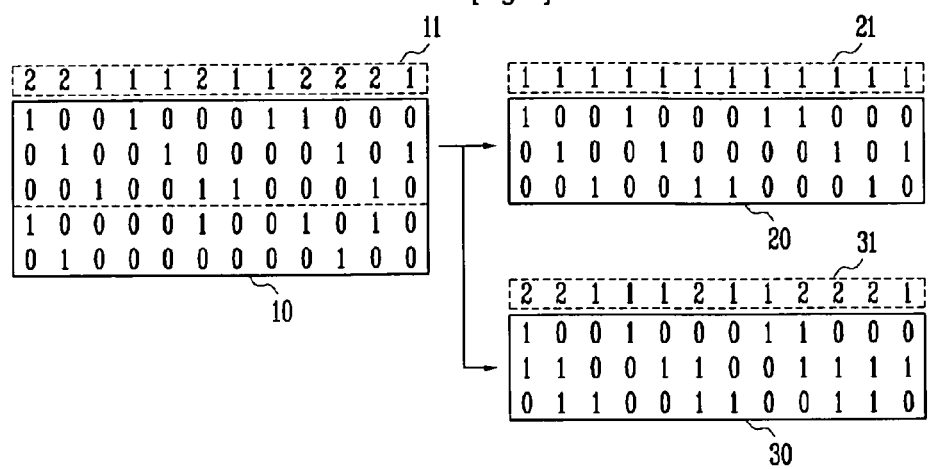
[Fig. 2]
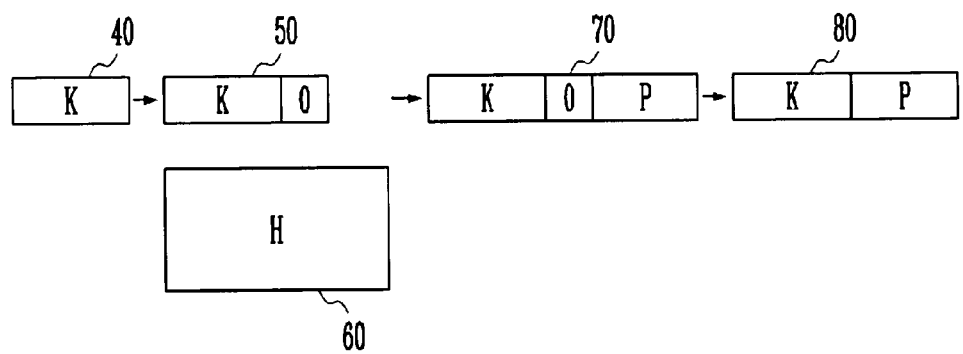

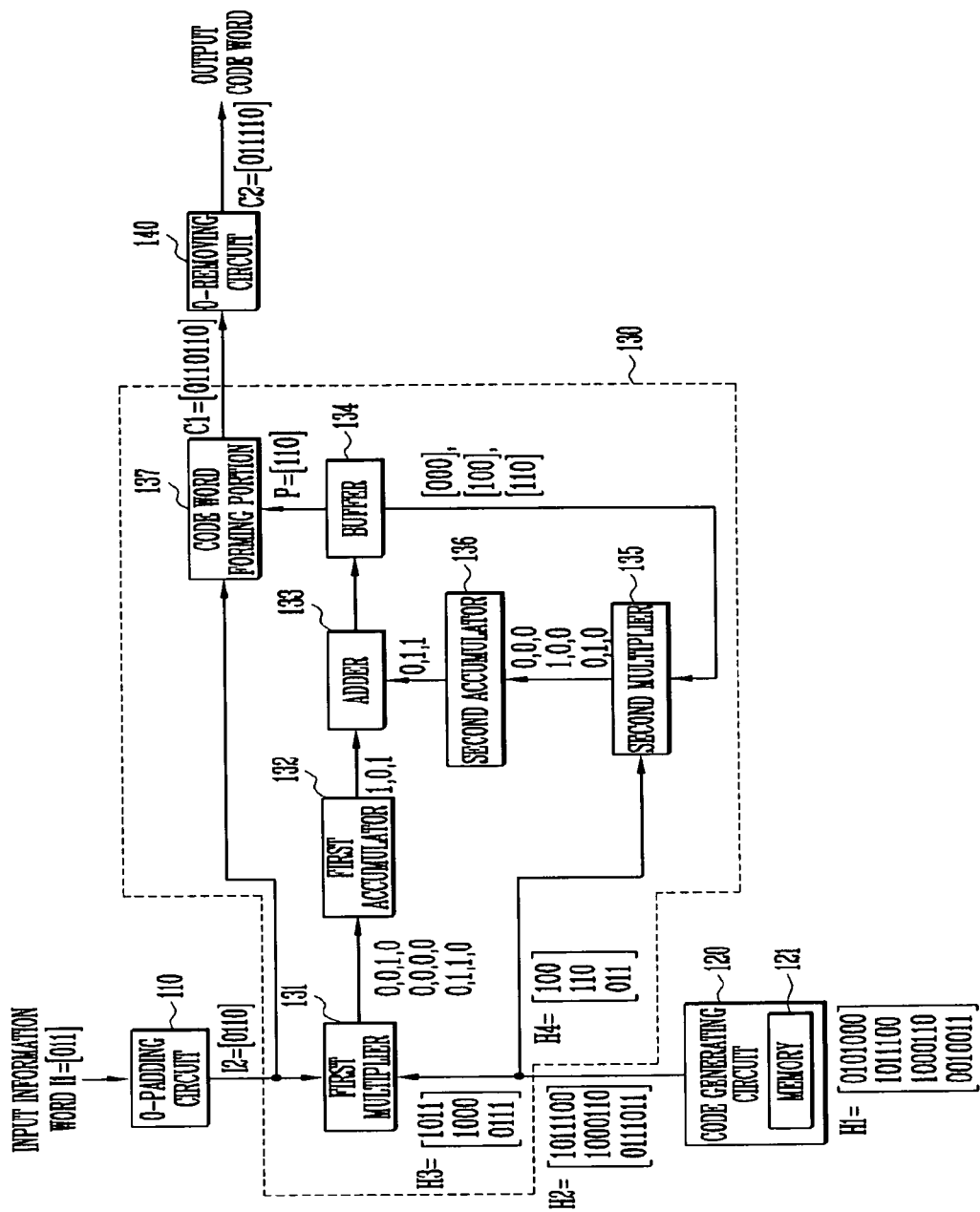
[Fig. 3]

[Fig. 4]
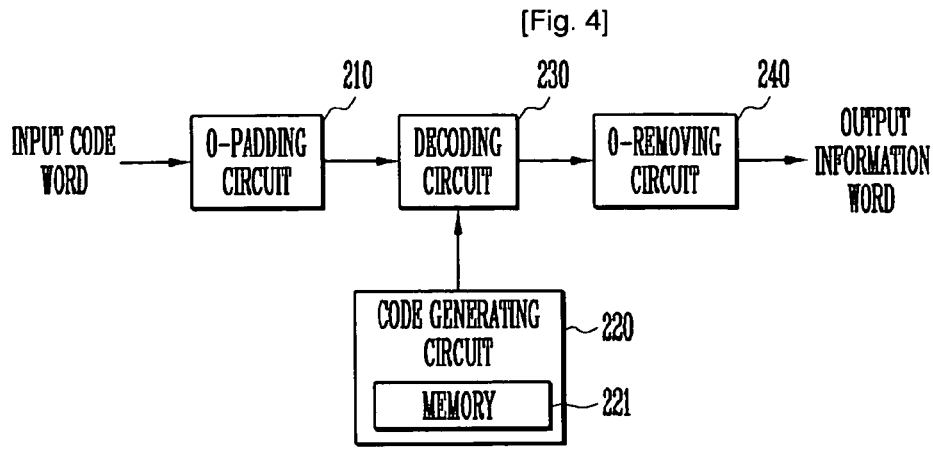
[Fig. 5]
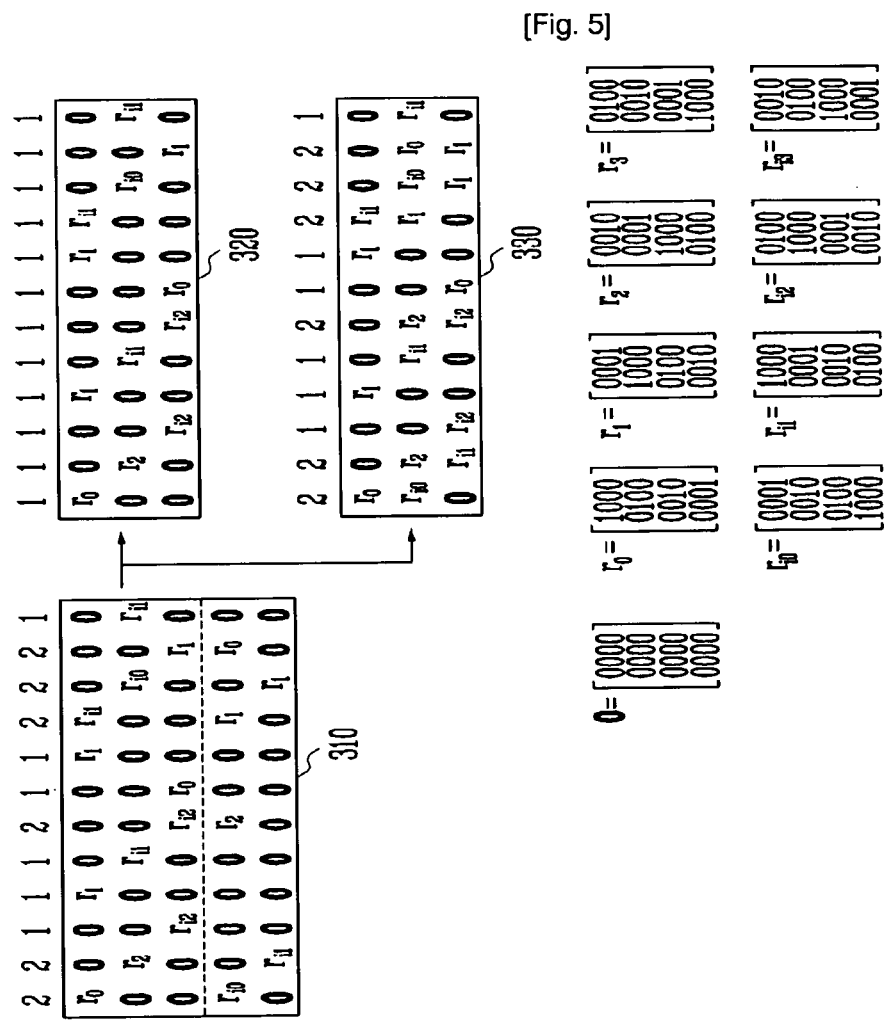

[Fig. 6]
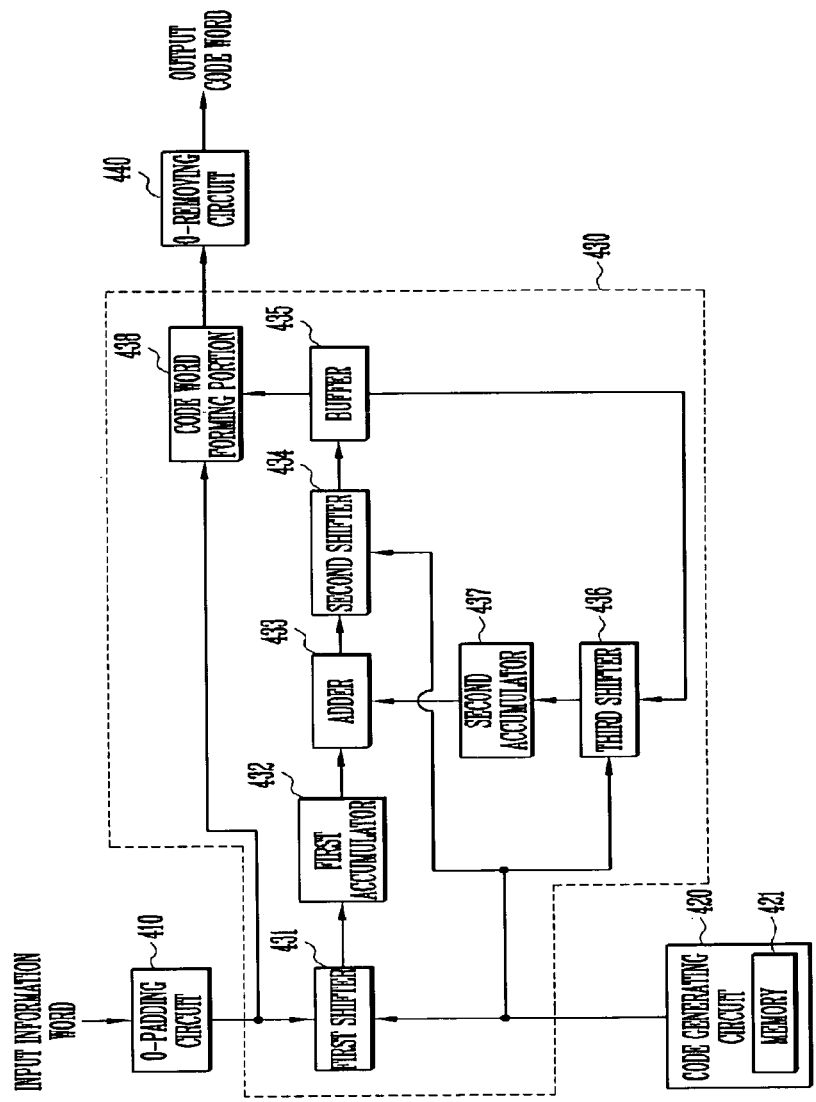
[Fig. 7]
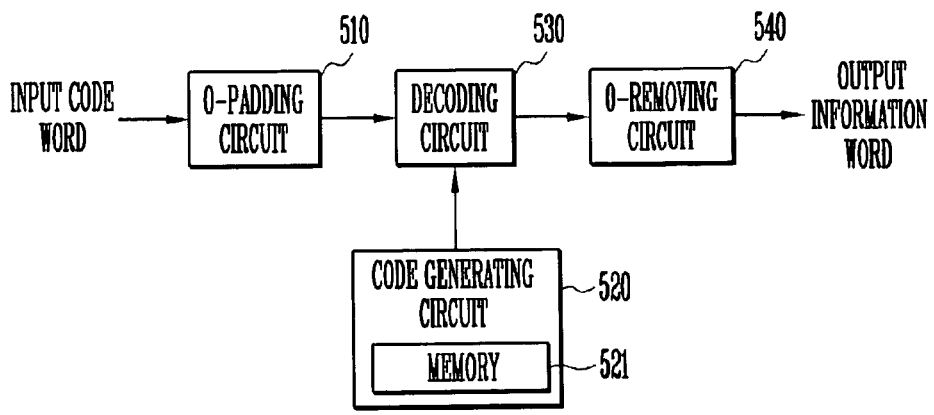

LDPC ENCODER AND DECODER AND LDPC ENCODING AND DECODING METHODS

BACKGROUND ART

1. Field of the Invention

The present invention relates generally to a low-density parity-check (LDPC) encoder, an LDPC decoder, and LDPC encoding and decoding methods, and more particularly to an LDPC encoder, an LDPC decoder, and LDPC encoding and decoding methods in which the size of a memory of the encoder and decoder can be reduced by forming a small LDPC code from a large LDPC code (also called parity check matrix).

2. Description of Related Art

The low-density parity-check (LDPC) code invented in 1962 by Robert Gallager is a linear block code defined by a very sparse parity check matrix, which is populated primarily with zeros and sparsely with ones. When it was first introduced, the LDPC code was too complicated to implement, and so it was forgotten for a long time until not too long ago. The LDPC code was brought to light again in 1995, and an irregular LDPC code (which is a generalization of the LDPC code suggested by Robert Gallager) was introduced in 1998. When the LDPC code was first introduced by Gallager, a probabilistic decoding algorithm was also suggested, and the LDPC code which is decoded using this algorithm exhibited excellent performance characteristics. The LDPC code also showed improved performance when extended to non-binary code as well as binary code to define code words. Like the turbo code, the LDPC code yields a bit error rate (BER) approaching a Shannon channel capacity limit, which is the theoretical maximum amount of digital data that can be transmitted in a given bandwidth in presence of a certain noise interference. The irregular LDPC code which is known to have the best performance only needs an additional 0.13 dB from the Shannon channel capacity to achieve a BER of $10^{-6}$ when a code length is a million bits in an additive white Gaussian noise (AWGN) channel environment, and is thus suitable for applications which require high-quality transmission with a very low BER.

Unlike algebraic decoding algorithms usually used for decoding a block code, the decoding algorithm of the LDPC code is a probabilistic decoding algorithm to which a belief-propagation algorithm, which employs a graph theory and a guessing theory, is applied "as is". An LDPC decoder computes a probability of a bit corresponding to each bit of a code word received through a channel being "1" or "0". The probability information computed by the LDPC decoder is referred to as a message, and the quality of the message can be checked through each parity defined in a parity check matrix. If a certain parity of the parity check matrix is satisfied, i.e., the result of a parity check is positive, the computed message is specially referred to as a parity check message and contains the most probable value of each code word bit. The parity check message for each parity is used to determine the value of a corresponding bit, and information on a computed bit is referred to as a bit message. Through a procedure of repeating such message transmission, the information for bits of each code word comes to satisfy all parities of the parity-check matrix. Finally, when all parities of the parity-check matrix are satisfied, the decoding of the code word is finished. In an environment where a signal to noise (S/N) ratio is low, systematic codes are used, and thus certain portions of the code word are extracted to reproduce information bits.

If a channel is a frequency selective fading channel, adaptive modulation and coding is used for low-error communication. The LDPC code is a type of block channel code and thus has the disadvantage of being difficult to adaptively modulate compared to a trellis code such as a convolution code or a turbo code to which a desired form of modulation and coding can easily be applied through puncturing. In order for the LDPC code to support various code rates for adaptive transmission, it has to have various code matrices, which carries the disadvantage of the encoder and the decoder needing a large memory.

SUMMARY OF THE INVENTION

The present invention is directed to an LDPC encoder, an LDPC decoder, and LDPC encoding and decoding methods in which a size of a memory of the encoder and decoder can be reduced by forming, from one parity-check matrix, a smaller parity-check matrix.

A first aspect of the present invention is to provide an LDPC encoder, including: a code generating circuit including a memory which stores a first parity check matrix and summing a first row which is at least one row of the first parity check matrix and a second row which is at least one of the remaining rows of the first parity check matrix to output a second parity check matrix; and an encoding circuit receiving the second parity check matrix and an information word to output an LDPC-encoded code word.

A second aspect of the present invention is to provide an LDPC decoder, including: a code generating circuit including a memory which stores a first parity check matrix and summing a first row which is at least one row of the first parity check matrix and a second row which is at least one of the remaining rows of the first parity check matrix to output a second parity check matrix; and a decoding circuit receiving the second parity check matrix and a code word to output an LDPC-decoded information word.

A third aspect of the present invention is to provide an LDPC encoder, including: a code generating circuit including a memory which stores a first parity check matrix and outputting a second parity check matrix formed by removing a first row which is at least one row of the first parity check matrix; and an encoding circuit receiving the second parity check matrix and an information word to output an LDPC-encoded code word.

A fourth aspect of the present invention is to provide an LDPC decoder, including: a code generating circuit including a memory which stores a first parity check matrix and outputting a second parity check matrix formed by removing a first row which is at least one row of the first parity check matrix; and a decoding circuit receiving the second parity check matrix and a code word to output an LDPC-decoded information word.

A fifth aspect of the present invention is to provide an LDPC encoding method, including: storing a first parity check matrix in a memory; summing a first row which is at least one row of the first parity check matrix and a second row which is at least one of the remaining rows of the first parity check matrix to form a second parity check matrix; and receiving the second parity check matrix and an information word and performing LDPC-encoding.

A sixth aspect of the present invention is to provide an LDPC decoding method, including: storing a first parity check matrix in a memory; summing a first row which is at least one row of the first parity check matrix and a second row which is at least one of the remaining rows of the first parity check matrix to form a second parity check matrix; and receiving the second parity check matrix and a code word and performing LDPC-decoding.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 1 illustrates a basic concept employed in an LDPC encoder, an LDPC decoder, and LDPC encoding and decoding methods according to a first exemplary embodiment of the present invention;

FIG. 2 illustrates a method for changing the length of a code word using the basic concept of FIG. 1;

FIG. 3 is a block diagram of the LDPC encoder according to the first exemplary embodiment of the present invention;

FIG. 4 is a block diagram of the LDPC decoder according to the first exemplary embodiment of the present invention;

FIG. 5 illustrates a basic concept of an LDPC encoder, an LDPC decoder, and LDPC encoding and decoding methods according to a second exemplary embodiment of the present invention;

FIG. 6 is a block diagram of the LDPC encoder according to the second exemplary embodiment of the present invention; and FIG. 7 is a block diagram of the LDPC decoder according to the second exemplary embodiment of the present invention.

DETAILED DESCRIPTION OF THE PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art. In the following description, same drawing reference numerals are used for the same elements even in different drawings, and explanations of the same elements are omitted.

FIG. 1 illustrates a basic concept employed in an LDPC encoder, an LDPC decoder, and LDPC encoding and decoding methods according to a first exemplary embodiment of the present invention.

Referring to FIG. 1, a first matrix 10 is a large-sized 5×2 parity check matrix. In an upper portion 11 of the first matrix 10, each column of the upper portion 11 indicates the number of 1s present in the same column in each of the five rows. Second and third matrices 20 and 30 are small-sized 3×2 parity check matrices that can be made from the large-sized first matrix 10. In the upper portions 21 and 31 of the second and third matrices 20 and 30 respectively, each column of the upper portion 21 or 31 indicates the number of 1s present in the same column in each of the three lows in the corresponding matrix 20 or 30.

The number of rows of a parity check matrix (such as 10, 20, 30) represents the number of parities, and the number of columns thereof represents the length of a code word. Thus, the greater the number of rows (i.e., the number of parities), the lower will be the coding rate, and the greater the number of the columns (i.e., the length of the code word), the longer will be the code word. Thus, the second and third matrices 20 and 30 in FIG. 1 have higher coding rates than the large-sized first matrix 10.

The second matrix 20 is formed by removing certain rows of the first matrix 10, and thus the number of 1s present in each column of the second matrix 20 is reduced when compared to the corresponding column of the large-sized first matrix 10. However, the decoding performance is lowered whenever the number of 1s in each column of a parity check matrix (such as 20) is reduced.

The third matrix 30 is formed by column-wise summing certain rows of the first matrix 10 and the certain remaining rows of the first matrix 10. In FIG. 1, the first row of the third matrix 30 is same as the first row of the large-sized first matrix 10. However, the second row of the third matrix 30 is a column-wise sum of the second and fourth rows of the first matrix 10, and the third row of the third matrix 30 is a column-wise sum of the third and fifth rows of the first matrix 10. In the case of the third matrix 30, because the number of 1s is not reduced in each column of the third matrix 30, the decoding performance is not lowered. Therefore, it is possible to make an LDPC code having various coding rates while maintaining a constant code word length if the number of rows is reduced by the above-described method. In forming the third matrix 30, if the certain two rows chosen in the large size first matrix 10 for summing have 1s in the same column in each of the chosen two rows (that is, the column in the two rows is said to "overlap" with 1s), the number of 1s in the row of the third matrix 30 will be reduced due to the summation of 1s in the column overlapping with 1s from the two rows chosen from the first matrix 10. Here in this example, exclusive-OR (EX-OR) operation is performed for summing. Thus in such a case, it is important to determine locations of 1s in the rows of the large size parity matrix in order to avoid that 1s do not appear in the same column location in both rows. Even in the case where many overlapping is appear in the same column of two rows chosen for summation, the number of 1s in the summed row will not be reduced if the sum is a logical sum obtained by performing an OR (instead of EX-OR) operation, and thus it will not greatly lower the performance characteristics.

If the small-sized parity check matrices 20 and 30 are formed from the large-sized parity check matrix 10 by the above-described method, there is no need for a memory for storing the small-sized parity check matrices 20 and 30, and thus the memory capacity required is reduced. Further, the matrix check matrix 30 formed by the summing method described above has an advantage of not greatly reducing the decoding performance.

FIG. 2 illustrates a method of changing the length of a code word using the basic concept of FIG. 1.

Referring to FIG. 2, a predetermined number of 0s are added to an input information word 40, i.e., K, to form a 0-padded information word 50. The 0-padded information word 50 is coded by a parity check matrix 60, i.e., H, and is then transformed into a code word 70, which additionally contains a parity P. A portion of the code word 70 corresponding to 0s is removed to form an output code word 80 having a desired length. The decoding process is performed such that 0s are added to a received code word (such as 80), and a LDPC decoding is then performed using the parity check matrix, and finally the 0s are removed from the result of the LDPC decoding.

If encoding and decoding are performed according to the above-described method, there is the advantage of being able to change the length of a code word without changing the length of a row of the parity check matrix.

FIG. 3 is a block diagram of an LDPC encoder according to a first exemplary embodiment of the present invention. Referring to FIG. 3, the LDPC encoder includes a 0-padding circuit 110, a code generating circuit 120, an encoding circuit 130, and a 0-removing circuit 140.

The 0-padding circuit 110 pads an input information word I1 with 0s and outputs the result. The 0-padding circuit 110 is an optional component added to change the length of the code word as described above. As shown in FIG. 3, when the information word I1, [011] is inputted, and if the 0-padding circuit 110 pads one 0 bit, the 0-padding circuit 110 outputs [0110] as a 0-padded information word I2.

The code-generating circuit 120 includes a memory 121 which stores a large-sized parity check matrix H1. The code generating unit 120 serves to transfer the large-sized parity check matrix H1 or a small-sized parity check matrix H2 formed from the large-sized parity check matrix H1 to the encoding circuit 130. The small-sized parity check matrix H2 is formed by removing some rows of the large-sized parity check matrix H1 (similar to the case of the matrix 20 in FIG. 1) or summing some rows of the large-sized parity check matrix H1 with some remaining rows (similar to the case of matrix 30 in FIG. 1). As shown in FIG. 3, if a 4×7 parity check matrix H1 is stored in the memory, a 3×7 parity check matrix H2 can be made from the 4×7 parity check matrix H1. Also, as shown in FIG. 3, if the small-sized parity check matrix is formed by removing an upper row of the parity check matrix H1 and summing it with a lower row, there is an advantage of maintaining the lower triangular form (e.g., the left triangular form). That is, if the large-sized parity check matrix H1 has a lower triangular form in which the right-upper portion of a 4×4 matrix located on its right side is filled with 0s, the small-sized parity check matrix H2 formed by summing at least one upper row of the parity check matrix H1 and at least one lower row also has a lower triangular form in which the right-upper portion of a 3×3 matrix located on its right side is filled with 0s. Since the parity check matrix is very sparse, i.e., it has far fewer is than 0s, the locations of the 1s can be stored in the memory to reduce required memory capacity. That is, the locations of the 1s can be stored in the form of (row number, column number) in the memory. For example, (1,2) (1,4), (2,1), . . . , (4,3), (4,6), and (4,7) can be stored in the memory. The code generating circuit 120 outputs the 3×7 parity check matrix H2 as shown in FIG. 3 by outputting the second row, the third row, and the column-wise sum of the first and fourth rows of the large-sized parity check matrix H1 stored in the memory 121 as the first, second, and third rows, respectively, of the parity check matrix H2.

The encoding circuit 130 applies the LDPC coding to the information word I2 outputted from the 0-padding circuit 110 by using the parity check matrix H2 outputted from the code generating circuit 120 to output a code word C1, i.e., [0110110]. That is, the encoding circuit 130 outputs C1 as a code word which satisfies the condition H2×C1$^T$=0. Here, C1$^T$ denotes the transpose of C1. A left element of the code word, i.e., "0110", corresponds to the 0-padded information word I2, and the rest of the code word C1, i.e., "110", corresponds to a parity check word.

The encoding circuit 130 of FIG. 3 is used when the LDPC code has a lower triangular form and includes a first multiplier 131, a first accumulator 132, an adder 133, a buffer 134, a second multiplier 135, a second accumulator 136, and a code word forming portion 137. The first multiplier 131 logically multiplies respective bits and sequentially outputs the product in order to calculate the product of I2$^T$ and a matrix H3 comprised of the first 4 columns in each of the three rows of the small-sized parity check matrix H2. The first accumulator 132 sums the values sequentially outputted from the first multiplier 131 in units of the rows and outputs the result. Here, the sum operation is an exclusive OR operation. The adder 133 sums a value output from the first accumulator 132, i.e., "1,0,1", and a value output from the second accumulator 136, i.e., "0,1,1", and outputs the result, i.e., "1,1,0". Here also, a sum operation is an exclusive OR operation. The buffer 134 serves to output the obtained parity bits. The buffer 134 first outputs [000] to the second multiplier 135 since there is no obtained code word at the initial stage, next receives 1 output from the adder 133 as a first parity bit and outputs [100] to the second multiplier 135, then receives 1 output from the adder 133 as a second parity bit and outputs [110] to the second multiplier 135, and finally receives 0 output from the adder 133 as a third parity bit and outputs [110] to the code word forming portion 137. The second multiplier 135 logically multiplies the respective bits and sequentially outputs the result in order to calculate the product of a matrix H4 made up of the last 3 columns in each of the three rows of the small-sized parity check matrix H2, and a transpose matrix output from the buffer 134. The second accumulator 136 sums values sequentially output from the second multiplier 135 in units of rows and outputs the result. Here, a sum operation is an exclusive OR operation. The code word forming portion 137 adds the parity check word P outputted from the buffer 134 to the 0-padded information word I2 to output the code word C1.

The 0-removing circuit 140 removes 0s from the code word C1 outputted from the encoding circuit 130. The 0-removing circuit 140 is an optional component added to change the length of the code word. Even if a fewer number of 0 bits than the number 0 bits added by the 0-padding circuit 110 is removed by the 0-removing circuit 140, the performance is not greatly affected.

If encoding is performed using the large-sized, i.e., 4×7, parity check matrix H1 as in the conventional art, an information word is 3 bits, a code word is 7 bits, and a coding rate is 3/7. However, if encoding is performed using the small-sized parity check matrix H2 and by padding and removing 0s as in the present invention, an information word is 3 bits, a code word is 6 bits, and a coding rate is 1/1. As described above, the length of the information word, the length of the code word, and the coding rate can be adjusted by adjusting 0 bits added and removed and rows of the parity check matrix. Also, the required memory size can be reduced by obtaining the small-sized parity check matrix H2 from the large-sized parity check matrix H1.

FIG. 4 is a block diagram of the LDPC decoder according to the first exemplary embodiment of the present invention. Referring to FIG. 4, the LDPC decoder includes a 0-padding circuit 210, a code generating circuit 220, a decoding circuit 230, and a 0-removing circuit 240.

The 0-padding circuit 210 pads 0s corresponding to 0s removed in the 0-removing circuit 140 to the received input code word.

The code generating circuit 220 includes a memory 221 which stores the large-sized parity check matrix and transfers the large-sized parity check matrix or the small-sized parity check matrix formed from the large-sized parity check matrix to the decoding circuit 230. The code generating circuit 220 is substantially identical to the code generating circuit 120 of the encoder shown in FIG. 3.

The decoding circuit 230 serves to obtain an information word corresponding to the 0-padded information word I2 of the encoder using the 0-padded code word outputted from the 0-padding circuit 210 and the small-sized parity check matrix output from the code generating circuit 220.

The 0-removing circuit 240 removes 0s corresponding to 0s added by the 0-padding circuit 210 from the information word output from the decoding circuit to obtain an output information word corresponding to the input information word I1 of the encoder.

FIG. 5 illustrates a basic concept of an LDPC encoder, an LDPC decoder, and LDPC encoding and decoding methods according to a second exemplary embodiment of the present invention.

Referring to FIG. 5, a first matrix 310 is a large-sized parity check matrix, and second and third matrices 320 and 330 are small-sized parity check matrices. In the first to third matrices 310, 320, 330, "0" denotes an M×M 0 matrix, $\gamma_0$ denotes an M×M unit matrix, $\gamma_1$, $\gamma_2$, and $\gamma_3$ denote matrices respectively formed by downwardly shifting the M×M unit matrix by 1, 2 and 3 rows, $\gamma_{i0}$ denotes a matrix formed by making the M×M unit matrix bilaterally symmetrical to $\gamma_0$, and $\gamma_{i1}$, $\gamma_{i2}$ and $\gamma_{i3}$ denote matrices respectively formed by downwardly shifting $\gamma_{i0}$ by 1, 2 and 3 rows. Here, M is an integer greater than or equal to 2, and in the second exemplary embodiment of the present invention M is 4. In the case where M is 4, the first matrix 310 has a size of 5×4 rows and 12×4 columns, and each of the second and third matrices 320, 330 has a size of 3×4 rows and 12×4 columns. Constructing these matrices in this way carries the advantage of requiring less memory to store the large-sized matrix H1 than the matrices of FIG. 1. That is, since the 0 matrix, $\gamma_0$, $\gamma_1$, $\gamma_2$, $\gamma_3$, $\gamma_{i0}$, $\gamma_{i1}$, $\gamma_{i2}$ and $\gamma_{i3}$ are already known, if the memory stores the 5×12 matrix (as in the case of 310), it is possible to generate the matrix of 5×4 rows and 12×4 columns, thereby requiring less memory. The upper portions of the first to third matrices 310 to 330 indicate the number of is for respective columns of the matrices.

The second matrix 320 is formed by removing some rows of the first matrix 310. In this case, since the number of 1s of respective columns is reduced, there may be a problem with lowering the decoding performance.

The third matrix 330 is formed by summing certain rows and certain other rows of the first matrix 310. In this case of the third matrix 330, since the number of 1s of respective columns is not reduced, decoding performance is not greatly reduced.

In forming the third matrix 330, if $\gamma_0$, $\gamma_1$, $\gamma_2$, $\gamma_3$, $\gamma_{i0}$, $\gamma_{i1}$, $\gamma_{i2}$ and $\gamma_{i3}$ of two rows which are summed with each other overlap, the number of 1s of the overlapping columns is reduced. Thus, it is preferable to form the matrix so that 1s among $\gamma_0$, $\gamma_1$, $\gamma_2$, $\gamma_3$, $\gamma_{i0}$, $\gamma_{i1}$, $\gamma_{i2}$ and $\gamma_{i3}$ do not have the same location in both rows. Also, even if 1s among $\gamma_0$, $\gamma_1$, $\gamma_2$, $\gamma_3$, $\gamma_{i0}$, $\gamma_{i1}$, $\gamma_{i2}$ and $\gamma_{i3}$ have the same location in both rows, the number of is lost is not many if a sum is a logical sum, and thus the performance is not greatly lowered. Furthermore, when 1s among $\gamma_0$, $\gamma_1$, $\gamma_2$, $\gamma_3$, $\gamma_{i0}$, $\gamma_{i1}$, $\gamma_{i2}$ and $\gamma_{i3}$ have the same location in both rows which are summed, if an M×M matrix having two 1s per column is overlapping, unlike $\gamma_0$, $\gamma_1$, $\gamma_2$, $\gamma_3$, $\gamma_{i0}$, $\gamma_{i1}$, $\gamma_{i2}$ and $\gamma_{i3}$ in which there is only one 1 per column, the number of 1s of each column is not reduced and thus performance is not lowered.

If the small-sized parity check matrices 320 and 330 are formed from the large-sized parity check matrix 310 by the above-described method, there is no need for a memory for storing the small-sized parity check matrices 320 and 330, thereby reducing memory size. The parity check matrix 330 formed by the sum-up method described above has the advantage of maintaining constant decoding performance.

FIG. 6 is a block diagram of the LDPC encoder according to the second exemplary embodiment of the present invention. Referring to FIG. 6, the LDPC encoder includes a 0-padding circuit 410, a code generating circuit 420, an encoding circuit 430, and a 0-removing circuit 440.

The 0-padding circuit 410 pads the input information word with 0s and outputs the result. The information word output from the 0-padding circuit 410 is an integer multiple of M (that is, 4 in the second exemplary embodiment of the present invention). The 0-padding circuit 410 is an optional component added to change the length of the code word.

The code generating circuit 420 includes a memory 421 which stores the large-sized parity check matrix and serves to transfer the large-sized parity check matrix or the small-sized parity check matrix formed from the large-sized parity check matrix to the encoding circuit 430. The small-sized parity check matrix is formed in the code generating circuit 420 by removing some rows of the large-sized parity check matrix or summing some rows of the large-sized parity check matrix with some other rows thereof. Since the parity check matrix is very sparse, the locations of non-zero matrix elements $\gamma_0$, $\gamma_1$, $\gamma_2$, $\gamma_3$, $\gamma_{i0}$, $\gamma_{i1}$, $\gamma_{i2}$ and $\gamma_{i3}$ can be stored in the memory to reduce required memory capacity. That is, the locations of non-zero matrix elements $\gamma_0$, $\gamma_1$, $\gamma_2$, $\gamma_3$, $\gamma_{i0}$, $\gamma_{i1}$, $\gamma_{i2}$ and $\gamma_{i3}$ can be stored in the form of (row number, column number, value) in the memory.

The encoding circuit 430 applies the LDPC coding to the information word outputted from the 0-padding circuit 410 using the parity check matrix outputted from the code generating circuit 420 to output a code word. That is, the encoding circuit 430 outputs C as a code word which satisfies the condition $H \times C^T = 0$. Here, H is the parity check matrix and $C^T$ is the transpose of C.

The encoding circuit 430 of FIG. 6 is used when the LDPC code has a lower triangular form, and includes a first shifter 431, a first accumulator 432, an adder 433, a second shifter 134, a buffer 435, a third shifter 436, a second accumulator 437, and a code word forming portion 438. The first to third shifters 431, 434, and 436 perform a shift operation according to the parity check matrix. The size of the shift performed in the shift operation is M-bits (i.e., 4 bits in the second exemplary embodiment of the present invention). For example, if the uppermost 4 bits output from the 0-padding circuit 410 are [1110] and the parity check matrix output from the code generating circuit 420 is $\gamma_1$, the output of a shifter is [0111]. That is, the shifter shifts [1110] to the right by 1 bit and outputs the result. In the same way, when the LDPC codes are $\gamma_0$, $\gamma_1$, $\gamma_2$, and $\gamma_3$, the rightward shifting by 0, 1, 2, and 3 bits will result. When the LDPC codes are $\gamma_{i0}$, $\gamma_{i1}$, $\gamma_{i2}$ and $\gamma_{i3}$ the bisymmetrical arrangement and then rightward shifting by 0, 1, 2, and 3 bits will result. When the LDPC code is 0, [0000] will result. The remaining part of the parity check matrix outputted from the code generating circuit 420, excluding the lower triangular matrix part located on the right side of the parity check matrix, is outputted to the first shifter 431 which then performs the shift operation for the 0-padded information word using the matrix and outputs the result. The lower triangular matrix on the right of the parity check matrix output from the code generating circuit 420 is outputted to the third shifter 436. Diagonal values of the lower triangular matrix located on the right side of the parity check matrix outputted from the code generating circuit 420 are outputted to the second shifter 434. The first accumulator 432, the adder 433, the buffer 435, the second accumulator 437, and the code word forming portion 438 perform substantially the same operation as their counterparts in FIG. 1 except that they operate in units of M-bits. For example, if an output of the first shifter 431 corresponding to the first row is [0010], [1101], [0001], and [1010], the first accumulator 432 outputs a value [0100] obtained by performing an exclusive OR operation on the 4 matrices.

The 0-removing circuit 440 removes 0s from the code word output from the encoding circuit 430 and outputs the result. The 0-removing circuit 440 is an optional component added to change the length of the code word. If fewer 0 bits are removed by the 0-removing circuit 440 than are added by the 0-padding circuit 410, performance is not greatly affected. The length of the code word output from the 0-removing circuit 440 does not need to be an integer multiple of M.

FIG. 7 is a block diagram of the LDPC decoder according to the second exemplary embodiment of the present invention. Referring to FIG. 7, the LDPC decoder includes a 0-padding circuit 510, a code generating circuit 520, a decoding circuit 530, and a 0-removing circuit 540. The LDPC decoder of FIG. 7 is not much different from the LDPC decoder according to the first exemplary embodiment of the present invention, and thus will not be described in detail.

As described above, the LDPC encoder and decoder, and the LDPC encoding and decoding methods according to an embodiment of the present invention enable the size of a memory which stores the parity check code to be reduced.

Also, the LDPC encoder and decoder and the LDPC encoding and decoding methods according to an embodiment of the present invention enable the length of the code word and the coding rate to be adjusted.

Further, the LDPC encoder and decoder and the LDPC encoding and decoding methods according to an embodiment of the present invention maintain the small-sized parity check matrix in the lower triangular form as is when the large-sized parity check matrix has the lower triangular form by summing at least one upper row and at least one of the remaining rows of the large-sized parity check matrix stored in the memory.

Furthermore, the LDPC encoder and decoder and the LDPC encoding and decoding method according to the present invention carry the advantage of not greatly lowering the performance of the small-sized parity check matrix since the number of 1s of each column of the small-sized parity check matrix obtained from the large-sized parity check matrix is maintained the same or at least not reduced much.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A low-density parity-check (LDPC) encoder, comprising:
a code generating circuit including a memory which stores a first parity check matrix and summing a first row which is at least one row of the first parity check matrix and a second row which is at least one of the remaining rows of the first parity check matrix to output a second parity check matrix; and
an encoding circuit receiving the second parity check matrix and an information word to output an LDPC-encoded code word.

2. The LDPC encoder according to claim 1, further comprising:
a 0-padding circuit for generating the information word by padding an input information word with at least one 0 bit and transferring the information word to the encoding circuit; and
a 0-removing circuit for removing the at least one 0 bit from the code word output from the encoding circuit and outputting the result.

3. The LDPC encoder according to claim 1, wherein the first row is located in an upper portion of the first parity check matrix.

4. The LDPC encoder according to claim 2, wherein the first row is located in an upper portion of the first parity check matrix.

5. The LDPC encoder according to claim 1, wherein the sum is a logical sum.

6. The LDPC encoder according to claim 2, wherein the sum is a logical sum.

7. The LDPC encoder according to claim 1, wherein each element of the first parity check matrix is either 0 or 1.

8. The LDPC encoder according to claim 7, wherein the memory stores locations of 1s among the elements of the first parity check matrix.

9. The LDPC encoder according to claim 7, wherein in the first and second rows, locations of 1s do not overlap.

10. The LDPC encoder according to claim 7, wherein the encoding circuit comprises:
a first multiplier for multiplying a part of the second parity check matrix and the information word and outputting the result;
a first accumulator for outputting a first accumulation value obtained by summing the output of the first multiplier in units of rows;
an adder for summing the first accumulation value and a second accumulation value and outputting the result;
a buffer for outputting parity bits obtained from the output of the adder;
a second multiplier for multiplying the remaining part of the parity check matrix and the parity bits output from the buffer and outputting the result;
a second accumulator for outputting the second accumulation value obtained by summing the output of the second multiplier in units of rows; and
a code word forming portion for forming the code word using a parity check word finally obtained from the buffer and the information word and outputting the code word.

11. The LDPC encoder according to claim 2, wherein each element of the first parity check matrix is either 0 or 1.

12. The LDPC encoder according to claim 11, wherein the memory stores locations of 1s among the elements of the first parity check matrix.

13. The LDPC encoder according to claim 11, wherein in the first and second rows, locations of is do not overlap.

14. The LDPC encoder according to claim 11, wherein the encoding circuit comprises:
a first multiplier for multiplying a part of the second parity check matrix and the information word and outputting the result;
a first accumulator for outputting a first accumulation value obtained by summing the output of the first multiplier in units of rows;
an adder for summing the first accumulation value and a second accumulation value and outputting the result;
a buffer for outputting parity bits obtained from the output of the adder;
a second multiplier for multiplying the remaining part of the parity check matrix and the parity bits output from the buffer and outputting the result;
a second accumulator for outputting the second accumulation value obtained by summing the output of the second multiplier in units of rows; and
a code word forming portion for forming the code word using a parity check word finally obtained from the buffer and the information word and outputting the code word.

15. The LDPC encoder according to claim 1, wherein a value of each element of the first parity check matrix is one of a 0 matrix, $\gamma_0$ to $\gamma_{(M-1)}$ matrices, and $\gamma_{i0}$ to $\gamma_{i(M-1)}$ matrices, where M is a natural number greater than or equal to 2, the $\gamma_0$ to $\gamma_{(M-1)}$ matrices are formed by shifting a unit matrix by 0 to (M−1) bits, and the $\gamma_{i0}$ to $\gamma_{i(M-1)}$ matrices are formed by making the unit matrix symmetric and then shifting it by 0 to (M−1) bits.

16. The LDPC encoder according to claim 15, wherein the memory stores locations and values of the $\gamma_0$ to $\gamma_{(M-1)}$ matrices and the $\gamma_{i0}$ to $\gamma_{i(M-1)}$ matrices among the elements of the first parity check matrix.

17. The LDPC encoder according to claim 15, wherein in the first and second rows, locations of the $\gamma_0$ to $\gamma_{(M-1)}$ matrices and the $\gamma_{i0}$ to $\gamma_{i(M-1)}$ matrices do not overlap.

18. The LDPC encoder according to claim 15, where in the first and second rows, if locations of the $\gamma_0$ to $\gamma_{(M-1)}$ matrices and the $\gamma_{i0}$ to $\gamma_{i(M-1)}$ matrices overlap, an M×M matrix having two 1s in each column is located at the overlapping position.

19. The LDPC encoder according to claim 15, wherein the encoding circuit comprises:
   a first shifter for performing a shift operation for the information word corresponding to a part of the second parity check matrix excluding a lower triangular matrix located on the right of the second parity check matrix and outputting the result;
   a first accumulator for outputting a first accumulation value obtained by summing the output of the first shifter;
   an adder for summing the first accumulation value and a second accumulation value and outputting the result;
   a second shifter for performing a shift operation for the output of the adder corresponding to diagonal values of the lower triangular matrix located on the right of the second parity check matrix and outputting the result;
   a buffer for outputting parity bits obtained from the output of the second shifter;
   a third shifter for performing a shift operation for the parity bits output from the buffer corresponding to the lower triangular matrix located on the right of the second parity check matrix and outputting the result;
   a second accumulator for outputting the second accumulation value obtained by summing the output of the third shifter; and
   a code word forming portion for forming the code word using a parity check word finally obtained from the buffer and the information word and outputting the code word.

20. The LDPC encoder according to claim 2, wherein a value of each element of the first parity check matrix is one of a 0 matrix, $\gamma_0$ to $\gamma_{(M-1)}$ matrices, and $\gamma_{i0}$ to $\gamma_{i(M-1)}$ matrices, where M is a natural number greater than or equal to 2, the $\gamma_0$ to $\gamma_{i(M-1)}$ matrices are formed by shifting a unit matrix by 0 to (M−1) bits, and the $\gamma_{i0}$ to $\gamma_{i(M-1)}$ matrices are formed by making the unit matrix symmetric and then shifting it by 0 to (M−1) bits.

21. The LDPC encoder according to claim 20, wherein the memory stores locations and values of the $\gamma_0$ to $\gamma_{(M-1)}$ matrices and the $\gamma_{i0}$ to $\gamma_{i(M-1)}$ matrices among the elements of the first parity check matrix.

22. The LDPC encoder according to claim 20, wherein in the first and second rows, locations of the $\gamma_0$ to $\gamma_{(M-1)}$ matrices and the $\gamma_{i0}$ to $\gamma_{i(M-1)}$ matrices do not overlap.

23. The LDPC encoder according to claim 20, where in the first and second rows, if locations of the $\gamma_0$ to $\gamma_{(M-1)}$ matrices and the $\gamma_{i0}$ to $\gamma_{i(M-1)}$ matrices overlap, an M×M matrix having two 1s in each column is located at the overlapping position.

24. The LDPC encoder according to claim 20, wherein the encoding circuit comprises:
   a first shifter for performing a shift operation for the information word corresponding to a part of the second parity check matrix excluding a lower triangular matrix located on the right of the second parity check matrix and outputting the result;
   a first accumulator for outputting a first accumulation value obtained by summing the output of the first shifter;
   an adder for summing the first accumulation value and a second accumulation value and outputting the result;
   a second shifter for performing a shift operation for the output of the adder corresponding to diagonal values of the lower triangular matrix located on the right of the second parity check matrix and outputting the result;
   a buffer for outputting parity bits obtained from the output of the second shifter;
   a third shifter for performing a shift operation for the parity bits output from the buffer corresponding to the lower triangular matrix located on the right of the second parity check matrix and outputting the result;
   a second accumulator for outputting the second accumulation value obtained by summing the output of the third shifter; and
   a code word forming portion for forming the code word using a parity check word finally obtained from the buffer and the information word and outputting the code word.

25. An LDPC decoder, comprising:
   a code generating circuit including a memory which stores a first parity check matrix and summing a first row which is at least one row of the first parity check matrix and a second row which is at least one of the remaining rows of the first parity check matrix to output a second parity check matrix; and
   a decoding circuit receiving the second parity check matrix and a code word to output an LDPC-decoded information word.

26. The LDPC decoder according to claim 25, further comprising,
   a 0-padding circuit for generating the code word by padding at least one 0 bit to an input code word and transferring the code word to the decoding circuit; and
   a 0-removing circuit for removing the at least one 0 bit from the LDPC-decoded information word output from the decoding circuit.

27. The LDPC decoder according to claim 25, wherein the first row is located in an upper portion of the first parity check matrix.

28. The LDPC decoder according to claim 26, wherein the first row is located in an upper portion of the first parity check matrix.

29. The LDPC decoder according to claim 25, wherein the sum is a logical sum.

30. The LDPC decoder according to claim 26, wherein the sum is a logical sum.

31. The LDPC decoder according to claim 25, wherein each element of the first parity check matrix is either 0 or 1.

32. The LDPC decoder according to claim 31, wherein the memory stores locations of 1s among the elements of the first parity check matrix.

33. The LDPC decoder according to claim 31, wherein in the first and second rows, locations of 1s do not overlap.

34. The LDPC decoder according to claim 26, wherein each element of the first parity check matrix is either 0 or 1.

35. The LDPC decoder according to claim 34, wherein the memory stores locations of 1s among the elements of the first parity check matrix.

36. The LDPC decoder according to claim 34, wherein in the first and second rows, locations of 1s do not overlap.

37. The LDPC decoder according to claim 25, wherein a value of each element of the first parity check matrix is one of a 0 matrix, $\gamma_0$ to $\gamma_{(M-1)}$ matrices, and $\gamma_{i0}$ to $\gamma_{i(M-1)}$ matrices, where M is a natural number greater than or equal to 2, the $\gamma_0$ to $\gamma_{(M-1)}$ matrices are formed by shifting a unit matrix by 0 to (M−1) bits, and the $\gamma_{i0}$ to $\gamma_{i(M-1)}$ matrices are formed by making symmetric the unit matrix symmetric and then shifting it by 0 to (M−1) bits.

38. The LDPC decoder according to claim 37, wherein the memory stores locations and values of the $\gamma_0$ to $\gamma_{(M-1)}$ matrices and the $\gamma_{i0}$ to $\gamma_{i(M-1)}$ matrices among the elements of the first parity check matrix.

39. The LDPC decoder according to claim 37, wherein in the first and second rows, locations of the $\gamma_0$ to $\gamma_{(M-1)}$ matrices and the $\gamma_{i0}$ to $\gamma_{i(M-1)}$ matrices do not overlap.

40. The LDPC decoder according to claim 37, where in the first and second rows, if locations of the $\gamma_0$ to $\gamma_{(M-1)}$ matrices and the $\gamma_{i0}$ to $\gamma_{i(M-1)}$ matrices overlap, an M×M matrix having two 1s in each column is located at the overlapping position.

41. The LDPC decoder according to claim 26, wherein a value of each element of the first parity check matrix is one of a 0 matrix, $\gamma_0$ to $\gamma_{(M-1)}$ matrices, and $\gamma_{i0}$ to $\gamma_{i(M-1)}$ matrices, where M is a natural number greater than or equal to 2, the $\gamma_0$ to $\gamma_{(M-1)}$ matrices are formed by shifting a unit matrix by 0 to (M−1) bits, and the $\gamma_{i0}$ to $\gamma_{i(M-1)}$ matrices are formed by making symmetric the unit matrix symmetric and then shifting it by 0 to (M−1) bits.

42. The LDPC decoder according to claim 41, wherein the memory stores locations and values of the $\gamma_0$ to $\gamma_{(M-1)}$ matrices and the $\gamma_{i0}$ to $\gamma_{i(M-1)}$ matrices among the elements of the first parity check matrix.

43. The LDPC decoder according to claim 41, wherein in the first and second rows, locations of the $\gamma_0$ to $\gamma_{(M-1)}$ matrices and the $\gamma_{i0}$ to $\gamma_{i(M-1)}$ matrices do not overlap.

44. The LDPC decoder according to claim 41, where in the first and second rows, if locations of the $\gamma_0$ to $\gamma_{(M-1)}$ matrices and the $\gamma_{i0}$ to $\gamma_{i(M-1)}$ matrices overlap, an M×M matrix having two 1s in each column is located at the overlapping position.

45. An LDPC encoder, comprising:
a code generating circuit including a memory which stores a first parity check matrix and outputting a second parity check matrix formed by removing a first row which is at least one row of the first parity check matrix; and
an encoding circuit receiving the second parity check matrix and an information word to output an LDPC-encoded code word.

46. An LDPC decoder, comprising:
a code generating circuit including a memory which stores a first parity check matrix and outputting a second parity check matrix formed by removing a first row which is at least one row of the first parity check matrix; and
a decoding circuit receiving the second parity check matrix and a code word to output an LDPC-decoded information word.

47. An LDPC encoding method, comprising:
storing a first parity check matrix in a memory;
summing a first row which is at least one row of the first parity check matrix and a second row which is at least one of the remaining rows of the first parity check matrix to form a second parity check matrix; and
receiving the second parity check matrix and an information word and performing LDPC-encoding.

48. An LDPC decoding method, comprising:
storing a first parity check matrix in a memory;
summing a first row which is at least one row of the first parity check matrix and a second row which is at least one of the remaining rows of the first parity check matrix to form a second parity check matrix; and
receiving the second parity check matrix and a code word and performing LDPC-decoding.

* * * * *